(12) United States Patent
Kuroshima

(10) Patent No.: US 6,881,905 B2
(45) Date of Patent: Apr. 19, 2005

(54) MOUNTING STRUCTURE OF A SUPERCONDUCTOR CIRCUIT

(75) Inventor: Yutaka Kuroshima, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 38 days.

(21) Appl. No.: 10/185,153

(22) Filed: Jun. 27, 2002

(65) Prior Publication Data
US 2003/0127574 A1 Jul. 10, 2003

(30) Foreign Application Priority Data
Jan. 10, 2002 (JP) ........................................ 2002-003857

(51) Int. Cl.[7] .............................................. H01B 12/06
(52) U.S. Cl. .................................. 174/125.1; 248/200
(58) Field of Search ........................ 174/125.1; 248/200; 52/782.1, 783.1, 796.1; 428/172, 432

(56) References Cited

U.S. PATENT DOCUMENTS

| 4,389,276 A | * | 6/1983 | deVries ...................... 156/630 |
| 4,950,173 A | * | 8/1990 | Minemura et al. ............ 439/82 |
| 5,107,649 A | * | 4/1992 | Benson et al. .............. 52/309.4 |
| 5,157,893 A | * | 10/1992 | Benson et al. ................ 52/792 |
| 5,175,975 A | * | 1/1993 | Benson et al. ................ 52/791 |
| 6,483,185 B1 | * | 11/2002 | Nagase et al. .............. 257/706 |
| 6,513,214 B1 | * | 2/2003 | Nishimura et al. ......... 29/25.35 |
| 6,623,844 B1 | * | 9/2003 | Nishimoto ................... 428/209 |

FOREIGN PATENT DOCUMENTS

JP          2000-114608         4/2000

* cited by examiner

Primary Examiner—Leslie A. Braun
Assistant Examiner—Steven Marsh
(74) Attorney, Agent, or Firm—John J. Penny, Jr.; Edwards & Angell, LLP

(57) ABSTRACT

A mounting structure of a superconductor circuit including a superconductor circuit substrate having a superconductor circuit, a base in which the superconductor circuit substrate is placed on a side of the base, a metal foil placed between the superconductor circuit substrate and the base, a fixing means for fixing the superconductor circuit substrate and the metal foil to a side of the base, a container which is vacuum-sealed after the superconductor circuit substrate, the base, the metal foil, and the fixing means are put into the container, and a penetrating hole formed in the -base and penetrated from a part of the base which is covered by the metal foil to a part of the base which is not in contact with the metal foil is provided.

10 Claims, 3 Drawing Sheets

MOUNTING STRUCTURE OF A SUPERCONDUCTOR CIRCUIT

CROSS REFERENCE TO RELATED APPLICATIONS

This patent application claims priority from Japanese patent application No. 2002-003857 filed on Jan. 10, 2002, the contents of which are incorporated herein by reference.

BACKGROUND OF THE INVENTION

1. Field of the Invention

The present invention relates to a mounting structure of a superconductor circuit. More particularly, the present invention relates to a structure of a base where the superconductor circuit is placed thereon.

2. Description of the Related Art

FIG. 1 shows a conventional mounting structure of the superconductor circuit. The superconductor circuit substrate 10 is made of, for example, a single crystalline sapphire. The superconductor circuit substrate 10 is placed on the base 20, where a metal foil 30 is inserted between the superconductor circuit substrate 10 and the base 20. The base 20 is made of, for example, an approximately rectangular parallelepiped of a conductive material. The metal foil 30 is made of a material whose plastic deformation makes it easy to put the material into a narrow gap, such as gold, or indium. The superconductor circuit substrate 10 is fixed to the base 20 by fixing means 40. The fixing means are, for example, bolts and screw holes formed on the base 20.

According to the conventional mounting structure of the superconductor circuit, gases around the superconductor circuit flow in when the superconductor circuit substrate 10 is fixed to the base 20 by the fixing means 40 while metal foil is inserted between the superconductor circuit substrate 10 and the base 20. Therefore, cracks are formed between the superconductor circuit substrate 10 and the metal foil, and between the metal foil and the base 20. Then, the gases that filled in said cracks are discharged slowly into the vacuum container where the mounting structure of the superconductor circuit is put in, and thereby the pressure status in the vacuum container may be deteriorated.

SUMMARY OF THE INVENTION

Therefore, it is an object of the present invention to provide a mounting structure of a superconductor circuit, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a mounting structure of a superconductor circuit includes a superconductor circuit substrate having a superconductor circuit, a base having a penetrating hole, wherein the superconductor circuit substrate is placed on one surface of the base, a metal foil placed between the superconductor circuit substrate and the base, a fixing means for fixing the superconductor circuit substrate and the metal foil to one surface of the base, and a container which is vacuum-sealed after the superconductor circuit substrate, the base, the metal foil and the fixing means are put into the container, wherein the penetrating hole is formed in the base and penetrated from a part of the base, which is covered by the metal foil, to a part of the base, which is not in contact with the metal foil.

The mounting structure of the superconductor circuit may have a penetrating hole formed in the metal foil and penetrated from a side in contact with the superconductor circuit substrate to a side in contact with the base.

The penetrating hole of the base and the penetrating hole of the metal foil may overlap at least partially. Moreover, the hole of the metal foil may be larger than that of the base.

The base may include a first element having a penetrating hole penetrating from a side in contact with the metal foil and covered by the metal foil to the other side and a second element having a ditch which reaches to the side other than the side in contact with the first element and a part of which overlaps with the penetrating hole of the first element.

The aperture on the side of the superconductor circuit substrate of the penetrating hole of the base may be placed closer to the center of the superconductor circuit substrate than the fixing position of the fixing means for the superconductor circuit substrate.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiments are not necessarily essential to the invention.

Figure 1:
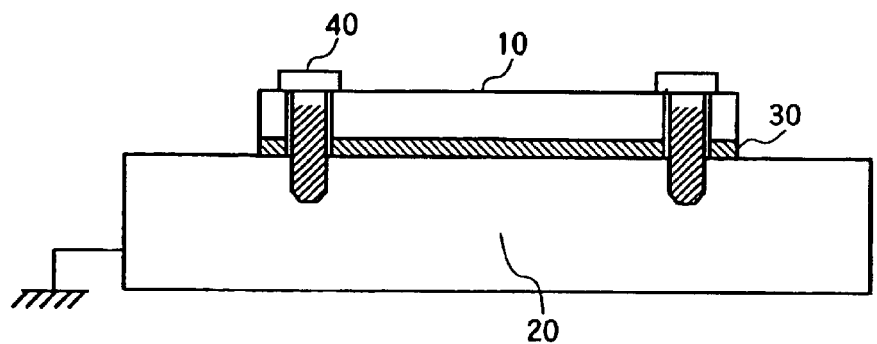
FIG. 1 shows a conventional mounting structure of the superconductor circuit.
Figure 2:
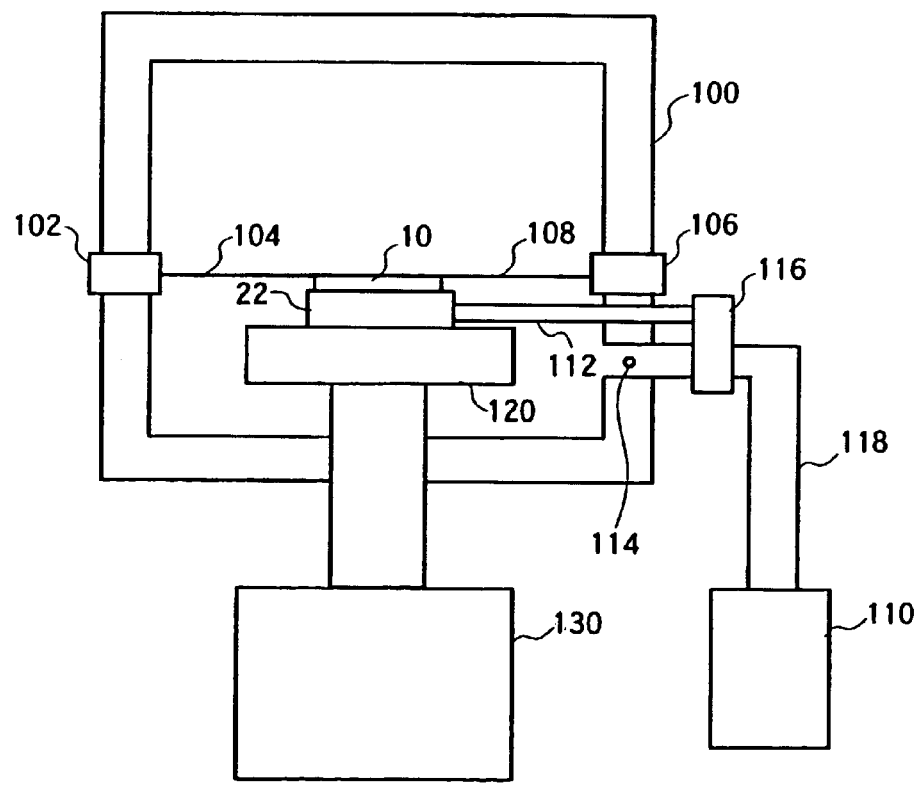
FIG. 2 shows an exemplary mounting structure of the superconductor circuit according to an embodiment of the present invention.

FIG. 2 shows an exemplary mounting structure of the superconductor circuit according to an embodiment of the present invention. The superconductor circuit substrate 10 is put into a vacuum container 100 while the substrate 10 is fixed on the base 22 because the superconductor circuit requires an extremely low temperature as an operating condition. The base 22 is placed on the cold head 120 in the vacuum container 100. The base 22 also functions as a ground for the superconductor circuit substrate 10. A freezer 130 cools down the superconductor circuit substrate 10 through the cold head 120 and the base 22. An input part of the superconductor circuit substrate 10 is connected to the superconductor substrate 10 via an input connector 102 set on the sidewall of the vacuum container 100 and a semi rigid cable 104. An output part of the superconductor substrate 10 is connected to the outer side of the vacuum container 100 via an output connector 106 set on the sidewall of the vacuum container 100 and a semi rigid cable 108.

The inside of the vacuum container 100 remains a vacuum by a vacuum pump 110. That is, the inside of the vacuum container 100 remains adiabatic. The vacuum pump 110 connects to a transformation valve 116 via a pipe 118. The transformation valve 116 connects to the vacuum container 100 via the pipe 114 and connects to the base 22 via pipe 112. That is, the vacuum pump 110 can pump out the base 22 and the vacuum container 100 to be a vacuum according to the configuration of the transformation valve 116.

By pumping out the base 22, gases flowing into the crack between the metal foil 30 and the base 22 may be reduced. Therefore, the adhesion of the metal foil 30 and the base 22 is improved, thereby the conductivity and heat conductivity of the metal foil 30 and the base 22 are improved.

Now, the process of the vacuum pumping of the vacuum container 100 is illustrated. First, the base 22 is pumped out to a vacuum by connecting the vacuum pump 110 to the base 22. Then, the vacuum container 100 is pumped out to the vacuum by manipulating the transformation valve 116. The inside of the vacuum container 100 is vacuum-adiabatic by pumping the inside of the vacuum container 100 and an extremely low temperature is maintained.

Two vacuum pumps for each of the base 22 and the vacuum container 100 may be used instead of using one vacuum pump. Moreover, the penetrating hole 50 of the base 22 and the inside of the vacuum container 100 may be pumped simultaneously instead of using the pipe 112 and the transformation valve 116.

Figure 3:
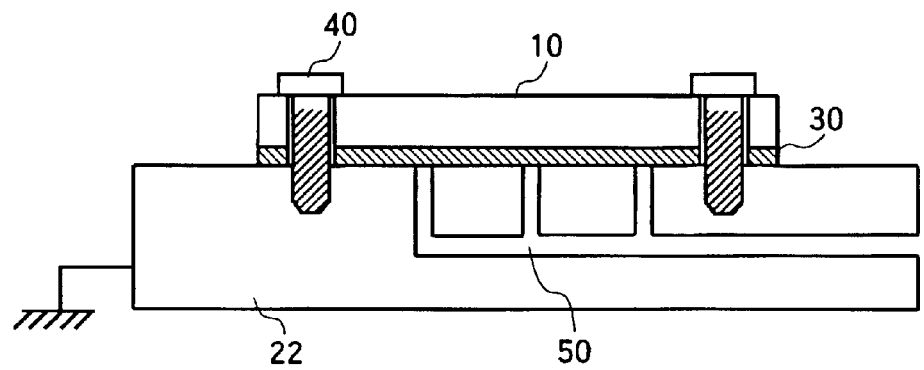
FIG. 3 shows an exemplary mounting structure of the superconductor circuit according to an embodiment of the present invention.

FIG. 3 shows an exemplary mounting structure of the superconductor circuit according to an embodiment of the present invention. The superconductor circuit substrate 10 is placed on the base 22, where the metal foil 30 is inserted therebetween. The superconductor circuit substrate 10 is fixed to the base 22 by the fixing means 40. The fixing means are bolts and screw holes formed in the base 22.

The base 22 is made as an approximately rectangular parallelepiped and has a penetrating hole 50 in a part which is covered by the metal foil 30. The penetrating hole 50 penetrates to the part other than the part which is covered by the metal foil 30, for example, a side of the base 22.

The aperture of the penetrating hole in which the penetrating hole is covered by the metal foil 30 is placed closer to the center of the superconductor circuit substrate than the fixing position of the fixing means 40 for the superconductor circuit substrate 10. By doing this, gases flowing in closer to the center of the superconductor circuit substrate than the fixing position of the fixing means 40 for the superconductor circuit substrate 10 are pumped up through the penetrating hole.

The clearance between the base 22 and the metal foil 30 is reduced according to pumping gases present in the crack between the metal foil 30 and the base 22 in a case that the base 22 is pumped out from the penetrating hole 50. Therefore, it is preferable that the fixing means has a means for preventing the bolts from becoming loose. An example of the means for preventing becoming loose is a spring washer.

Figure 4:
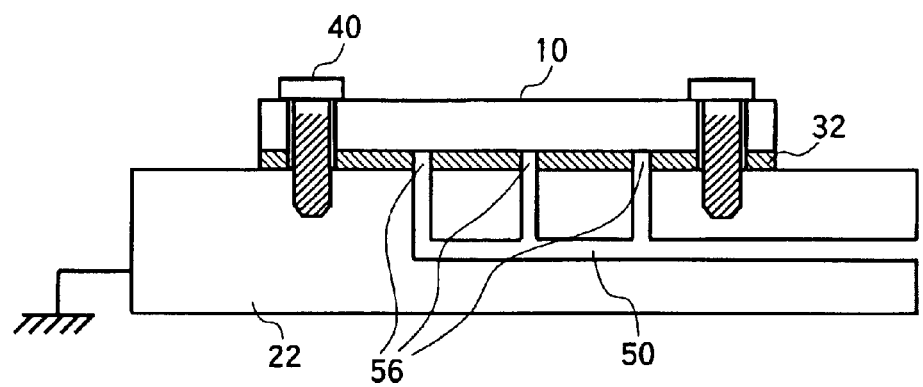
FIG. 4 shows an exemplary mounting structure of the superconductor circuit according to an embodiment of the present invention.

FIG. 4 shows a modified embodiment of FIG. 3. Each of the metal foil 32 and the base 22 has the penetrating holes. The penetrating hole 50 of the base 22 and the penetrating holes 56 of the metal foil 32 overlap at least partially when the superconductor circuit substrate 10 is placed on the base. Therefore, according to the modified embodiment of the present invention, gases present between the superconductor circuit substrate 10 and the metal foil 32 and between the metal foil 32 and the base 22 are removed by the vacuum pump 110. Therefore, there is adhesion between the superconductor circuit substrate 10 and the metal foil 32 as well as the adhesion between the metal foil 32 and the base 22.

Figure 5:
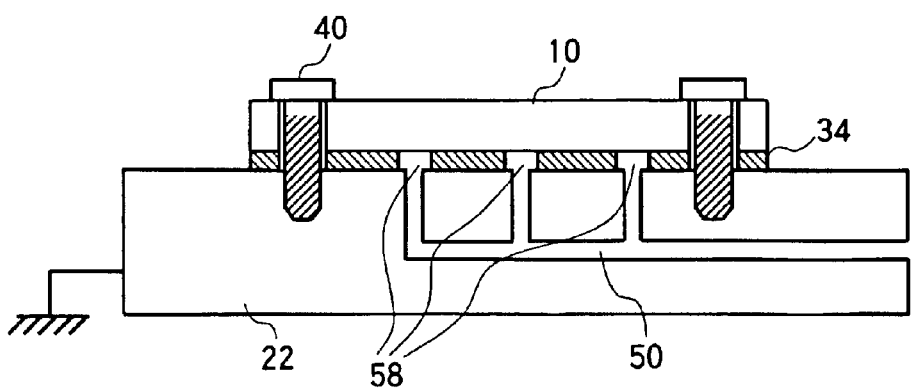
FIG. 5 shows an exemplary mounting structure of the superconductor circuit according to an embodiment of the present invention.

FIG. 5 shows a modified embodiment of FIG. 4. This embodiment is nearly the same as the embodiment of FIG. 4, but it is different from the embodiment of FIG. 4 in the point that the diameter of the penetrating hole 58 of the metal foil 34 is larger than that of the penetrating hole 50 of the base 22. By doing this, the metal foil is prevented from being sucked to the penetrating hole 50 of the base 22 when the inside of the base 22 is pumped out.

Figure 6:
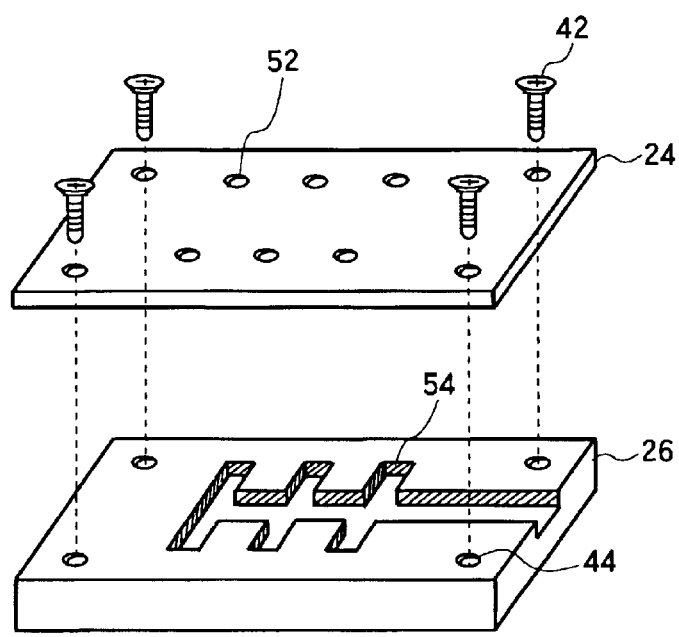
FIG. 6 illustrates a modified example of the base 22.

FIG. 6 shows a modified example of the base 22 of FIG. 2. The base 22 of this example includes a first element 24 having penetrating holes 52 penetrating from a side which is in contact with the metal foil 30 and covered by the metal foil 30 to the other side, a second element 26 having a ditch 54 which reaches to the side other than the side which is in contact with the first element 24 and a part of which overlaps with the penetrating holes 52 of the first element 24, and a fixing means 42 for fixing the first element 24 and the second element 26. The fixing means 42 are, for example, bolts and screw holes 44 formed on the second element 26.

The first element 24 is, for example, a planar element having penetrating holes 52. The second element 26 is, for example, a planar element having a ditch on the side which is in contact with the first element 24. The penetrating holes 52 of the first element 24 are formed using a drill. The ditch 54 of the second element 26 is formed using a fraise machine. The base 22 may be easily formed by dividing the base 22.

Figure 7:
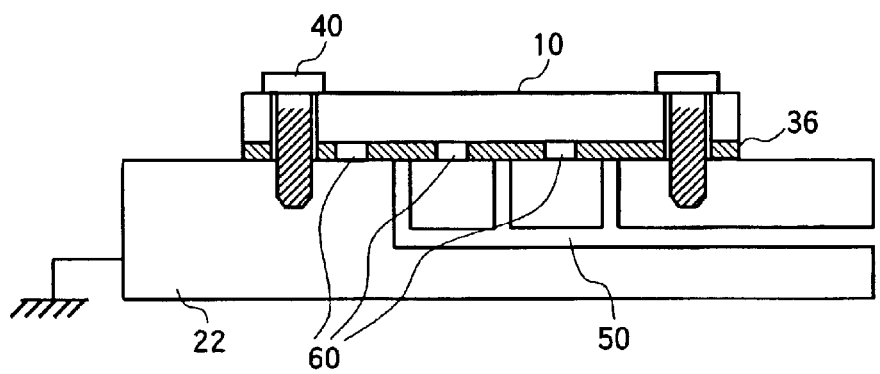
FIG. 7 shows an exemplary mounting structure of the superconductor circuit according to an embodiment of the present invention.

FIG. 7 shows a modified embodiment of FIG. 4. This embodiment is nearly the same as the fixing method of the superconductor circuit substrate 10, but the penetrating hole 50 of the base 22 does not overlap with the penetrating hole 60 of the metal foil 36.

As apparent from the above description, the adhesion between the superconductor circuit substrate, the metal foil and the base is improved by reducing gases present between the superconductor circuit substrate and the base which fixes the superconductor circuit substrate. Therefore, the stability of the temperature of cooling and the electric characteristics of the superconductor circuit substrate are improved.

Although the present invention has been described by way of exemplary embodiments, it should be understood that those skilled in the art might make many changes and substitutions without departing from the spirit and the scope of the present invention which is defined only by the appended claims.

What is claimed is:

1. A mounting structure of a superconductor circuit comprising:
   a superconductor circuit substrate having a superconductor circuit;
   a base having a first surface area on which said superconductor circuit is disposed and a second surface area which is not covered by said superconductor circuit, said base having a hollow passage communicating from said first surface area to said second surface area thereof;

a metal foil placed between said superconductor circuit substrate and said first surface area of said base;

a fixing means for fixing said superconductor circuit substrate and said metal foil to said first surface area of said base; and a container accommodating therein said superconductor circuit substrate, said base, said metal foil and said fixing means, said container being vacuum sealable.

2. The mounting structure of claim 1, wherein said metal foil comprises a hole penetrating from a first face which is in contact with said superconductor circuit substrate to a second face in contact with said base.

3. The mounting structure of claim 2, wherein said hollow passage of said base and said hollow passage hole of said metal foil overlap at least partially.

4. The mounting structure of claim 3, wherein said hole of said metal foil is larger than said hole of said base.

5. The mounting structure of claim 1, wherein said base comprises:

a first element having a penetrating hole penetrating from a side in contact with said metal foil and covered by said metal foil to the other side thereof; and a second element having a ditch which reaches to a portion other than the side in contact with said first element, and a part of which overlaps with said penetrating hole of said first element.

6. A mounting structure of a superconductor circuit comprising:

a base having a hole penetrating from a first side surface of the base to a second side surface thereof;

a superconductor circuit substrate having a superconductor circuit, said superconductor circuit substrate being placed on one surface of said base;

a metal foil placed between said superconductor circuit substrate and said first side surface of said base;

a fixing means for fixing said superconductor circuit substrate and said metal foil to said surface of said base;

a container accommodating therein said superconductor circuit substrate, said base, said metal foil and said fixing means, said container being vacuum sealable;

a first pipe connecting from said hole of said base to a vacuum pump disposed at an exterior of said container;

a second pipe connecting from said vacuum container to the vacuum pump; and a valve mechanism connecting said first pipe and said second pipe to the vacuum pump.

7. The mounting structure of claim 6, wherein said first pipe connects through said hole of said base to a hole penetrating said metal foil.

8. The mounting structure of claim 1, further comprising:

a first pipe connecting from said penetrating hole of said base to a first vacuum pump disposed at an exterior of said container;

a second pipe connecting from said vacuum container to the first vacuum pump;

a first valve mechanism connecting said first pipe to said first vacuum pump; and a second valve mechanism connecting said second pipe to said second vacuum pump.

9. The mounting structure of claim 2, wherein an aperture of the hollow passage of said base is closer to the center of the superconductor circuit than said fixing means.

10. The mounting structure of claim 2, wherein said hollow passage of said base and said hole of said metal foil do no not overlap.

* * * * *